United States Patent
Jelinek et al.

(10) Patent No.: US 6,199,207 B1
(45) Date of Patent: Mar. 6, 2001

(54) METHOD AND APPARATUS FOR ROUTING SIGNALS THROUGH A CABLE TELEVISION SIGNAL DISTRIBUTION AMPLIFIER

(75) Inventors: Catherine W. Jelinek, Lawrenceville; Mark A. Palazzo, Grayson; Stephan W. Vogt, Lawrenceville, all of GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/242,363

(22) PCT Filed: Jun. 3, 1997

(86) PCT No.: PCT/US97/09383

§ 371 Date: Feb. 11, 1999

§ 102(e) Date: Feb. 11, 1999

(87) PCT Pub. No.: WO97/47082

PCT Pub. Date: Dec. 11, 1997

Related U.S. Application Data

(60) Provisional application No. 60/019,323, filed on Jun. 3, 1996.

(51) Int. Cl.[7] ................................................. H04N 7/10
(52) U.S. Cl. .................. 725/149; 725/127; 330/51; 330/151; 333/101; 439/119; 439/225; 439/192
(58) Field of Search ................................. 348/6; 455/6.1; 330/51, 151; 333/100, 101; 439/43, 119, 180, 192, 225

(56) References Cited

U.S. PATENT DOCUMENTS

| | | | | |
|---|---|---|---|---|
| 3,600,599 | * | 8/1971 | Wright | 307/53 |
| 3,601,717 | * | 8/1971 | Kuechen | 333/17 |
| 3,881,160 | | 4/1975 | Ross . | |
| 3,983,486 | * | 9/1976 | Rheinfelder | 325/308 |
| 4,055,809 | * | 10/1977 | Takeuchi et al. | 325/308 |
| 4,298,844 | * | 11/1981 | Shimp | 330/124 |
| 4,581,644 | * | 4/1986 | Deiss | 358/181 |
| 4,963,966 | * | 10/1990 | Harney et al. | 358/349 |
| 5,434,610 | * | 7/1995 | Loveless | 348/6 |
| 5,756,935 | * | 5/1998 | Balanovsky et al. | 174/52.1 |

* cited by examiner

Primary Examiner—Andrew Faile
Assistant Examiner—Hai V. Tran
(74) Attorney, Agent, or Firm—Kelly A. Gardner; Kenneth M. Massaroni; Hubert J. Barnhardt, III

(57) ABSTRACT

A removable plug-in board for dividing incoming radio frequency (RF) to an external port and providing alternating current (AC) signals to a CATV system amplifier contains a radio frequency choke or inductor for passing the AC power signal, a high pass filter for passing the radio frequency signal and either a directional coupler or a splitter. This plug-in board is inserted into a motherboard on which is mounted amplification circuitry and power supply and divider circuitry. The plug-in board routes RF signals arriving on an input port of the amplifier motherboard through the directional coupler to the amplification circuitry, while additionally tapping off and feeding the incoming RF signals to a second output port of the amplifier motherboard. AC power signals arriving on the input port are fed through a radio frequency choke coil of the plug-in board to the external amplifier output port, through radio frequency choke coils to the main amplifier output port and to power supply and divider circuitry for providing power for the amplification circuitry. When the plug-in board is removed, RF signals arriving at the input port are fed directly through the amplification circuitry to the main amplifier output port and the AC signals are fed directly to power supply and divider circuitry to power the amplification circuitry and to the main amplifier output port. The external output port provided by the plug-in may also be used for power insertion.

9 Claims, 2 Drawing Sheets

METHOD AND APPARATUS FOR ROUTING SIGNALS THROUGH A CABLE TELEVISION SIGNAL DISTRIBUTION AMPLIFIER

This application claim benefit to Provisional Application 60/019,323 Jun. 3, 1996.

FIELD OF THE INVENTION

This invention relates to circuit apparatus for routing signals to multiple CATV distribution amplifiers, and more particularly to a method and apparatus for internally dividing radio frequency and alternating current power signals from the input (upstream) port of an amplifier circuit and then routing the signals to both an output port of the amplifier circuit and an additional port for coupling to a second amplifier circuit or a power inserter input.

BACKGROUND

Cable television signal distribution systems comprise signal delivery systems that are analogous, to the trunk and limbs of a tree. As cable television systems grow, new limbs and branches must be provided to reach new subscribers, for example, in new subdivisions, apartment building complexes and the like or to reach further into the territory served by the cable television service provider. In order to facilitate delivery of services to potential subscribers from the serving CATV facility, typically referred to as a headend, CATV (community antenna, television/cable television) systems may require the installation of either two co-located distribution amplifiers for a new branch of the tree or that the signal be split at a point along the coaxial cable prior to entering the distribution amplifier. If the signal is to be split it has been necessary to accomplish this by installing an external power passing splitter or coupler at or near the location of the amplifier, an implementation of which is shown in FIG. 1. An external power passing splitter 16a may require its own housing or additional space within a pedestal at the amplifier location, not only for the splitter, but also for the routing of the coaxial cable into and out of the splitter. In underground or buried cable installations, pedestals are used to house amplifiers and in overhead cable environments, amplifier casings and the like are mounted on poles or hung from strands supporting the cable. In both of these environments, and particularly in a pedestal (buried) environment, space for additional splitters and amplifiers and the like is at a premium. The alternative of providing a larger pedestal is not only economically undesirable but may be unattractive and run afoul of local utility or environmental regulations. Additionally, AC (alternating current) power to the CATV system must be interrupted in order to splice an external splitter into the coaxial cable for provision of service to feed a new branch of subscribers. This can cause disruption of service to all subscribers downstream of the amplifier location. Creation of such a splice also requires a fair amount of work by a specialized craftsperson resulting in down time. Moreover, the resulting splice may require additional shielding when completed to prevent serving signal loss or noise ingress, for example, from power, broadcast radio frequencies or telecommunications lines located nearby.

OBJECTS OF THE INVENTION

Accordingly, a primary object of the present invention is to provide a relatively simple, plug-in method for dividing a CATV signal at a desired point along the serving CATV distribution plant.

In particular, an object of the present invention is to split CATV signals via an internal signal divider located on an amplifier motherboard within an amplifier housing for containment within a pole or strand mounted casing or pedestal.

A further particular object of this invention is to reduce the work, system downtime, and space requirements for extending a cable distribution system to reach additional subscribers of a cable television system or for adding a power inserter into the system.

SUMMARY

In accordance with the principles of the present invention, a connector is provided on an amplifier motherboard for receiving at least one removable plug-in board for tapping off incoming RF and AC signals to provide an external output or for permitting power insertion to the amplifier. The motherboard and plug-in board, when installed, are both contained within an amplifier housing. The plug-in board in one embodiment contains a power passing, radio frequency choke or inductor and either a directional coupler or a splitter, along with an input (upstream) port and two output (downstream) ports. By input port here and throughout the following description is meant the upstream signal input from a headend and such an input as so defined permits both downstream and upstream signal flow, for example, for bidirectional telecommunications signals including digital data (for example, CATV system status monitoring), voice (for example, telephony) or video (for example, for remote broadcast feeds upstream or for video conferencing). Also, by output port is intended the downstream side of the element and such an output port permits both downstream and upstream signal flow. By distribution amplifier, whenever used herein, is intended the provision of amplification circuitry permitting a single input and a single or multiple outputs for serving multiple branches of the CATV distribution plant.

This plug-in board of the present invention is intended to be inserted into a receiving connector of a motherboard on which is mounted amplification circuitry and may be inserted either in the field or at the factory. The connector passes signals directly to the amplification circuitry when the plug-in card is not plugged into the connector and, when the plug-in is installed, the plug-in board routes radio frequency (RF) signals arriving on a coaxial or other cable input port of the amplifier motherboard through a directional coupler to the amplification circuitry, from which the signals are further routed to the main amplifier output port. The plug-in board additionally taps off and feeds the incoming RF signals to a second output port of the amplifier motherboard. In this manner, potential subscribers of new branches of a CATV distribution plant may be served with minimal disruption of service to existing downstream customers. Also, the additional external port may be utilized, not only for serving new customers, but as a power insertion point for providing power to the amplifier if, for example, insufficient power is available at either its input or output.

When the plug-in is installed, AC power signals arriving on the coaxial input port are fed through alternating current passing inductors (radio frequency choke coils) to the new second, tapped off, port, as well as through another radio frequency choke to the main amplifier output port via power supply and divider circuitry for providing power for the amplification circuitry of the motherboard and any other upstream or downstream amplifiers as desired. If the plug-in board is removed, the RF signals arriving at the input port are fed directly through the amplification circuitry of the motherboard to the main amplifier output port and the AC signals are fed directly through the radio frequency choke to power supply and divider circuitry for powering the amplification circuitry and to the main amplifier output port.

DETAILED DESCRIPTION OF THE PREFERRED EMBODIMENT

Figure 1:
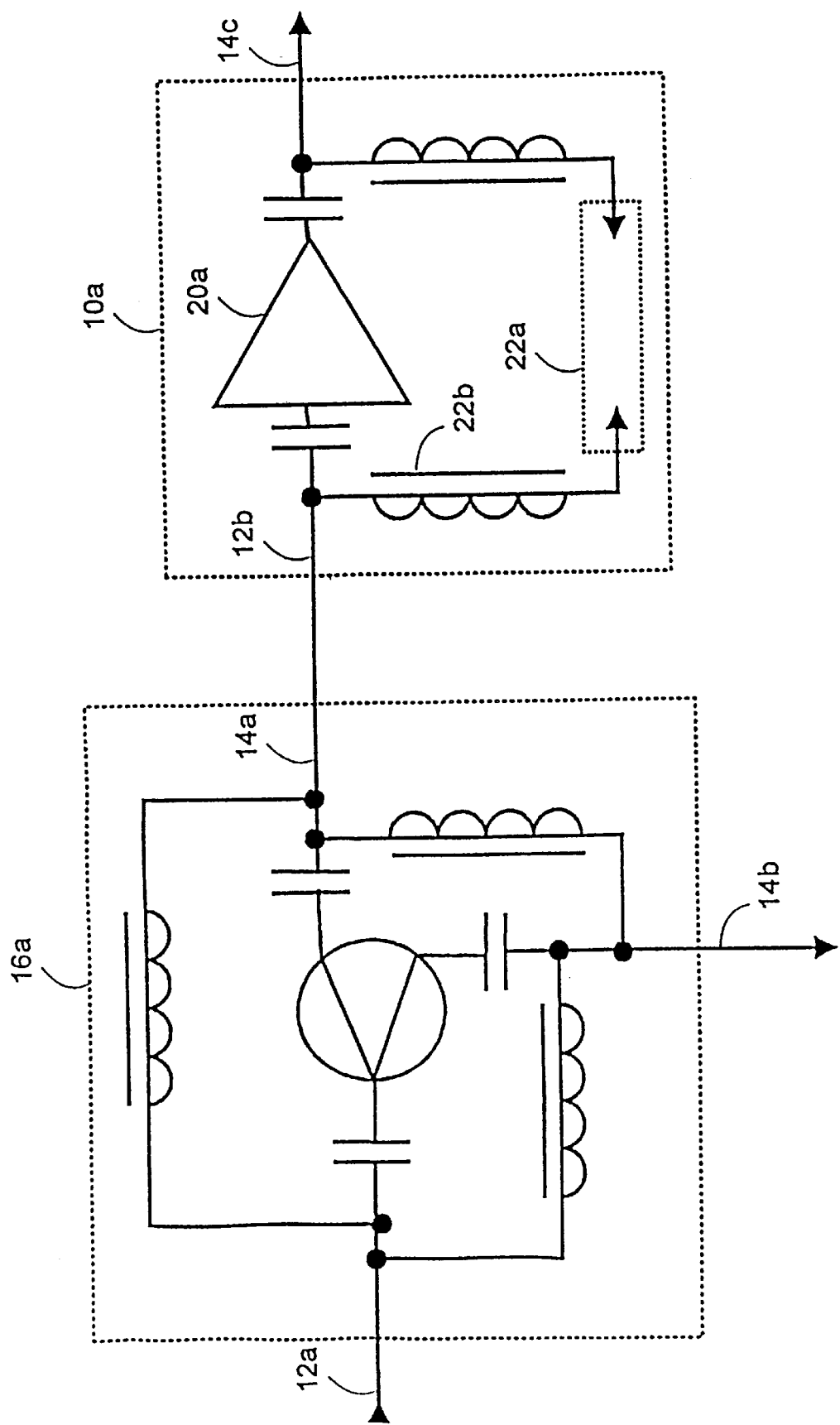
FIG. 1 is a simplified schematic diagram of a prior art arrangement having a distribution amplifier connected to a separate, external power passing tap.

Referring to a prior art distribution amplifier arrangement with external tap shown in FIG. 1, an amplifier housing 10a is connected to an external power passing and radio frequency signal divider 16a. Divider 16a must be physically installed in a CATV distribution plant when a new branch for serving potential new subscribers is required, resulting in some service down time and increased space requirements, for example, in a pedestal. Divider 16a receives an RF and an AC signal on input port 12a, and couples these signals through output port 14a to the input port 12b of amplifier 10a. Tap 16a also routes the AC and radio frequency signals on input port 12a to output port 14b for distribution to other amplifiers. The RF signal on input port 12b of amplifier 10a is fed through amplification circuitry 20a via capacitors (which pass radio frequency signals and block low frequency AC power) to output port 14c. The AC signal on input port 12b is fed through radio frequency choke circuits 22b to power supply and director circuitry 22a within housing 10a which in turn provides power to amplifier 20a and any other components requiring power.

Figure 2:
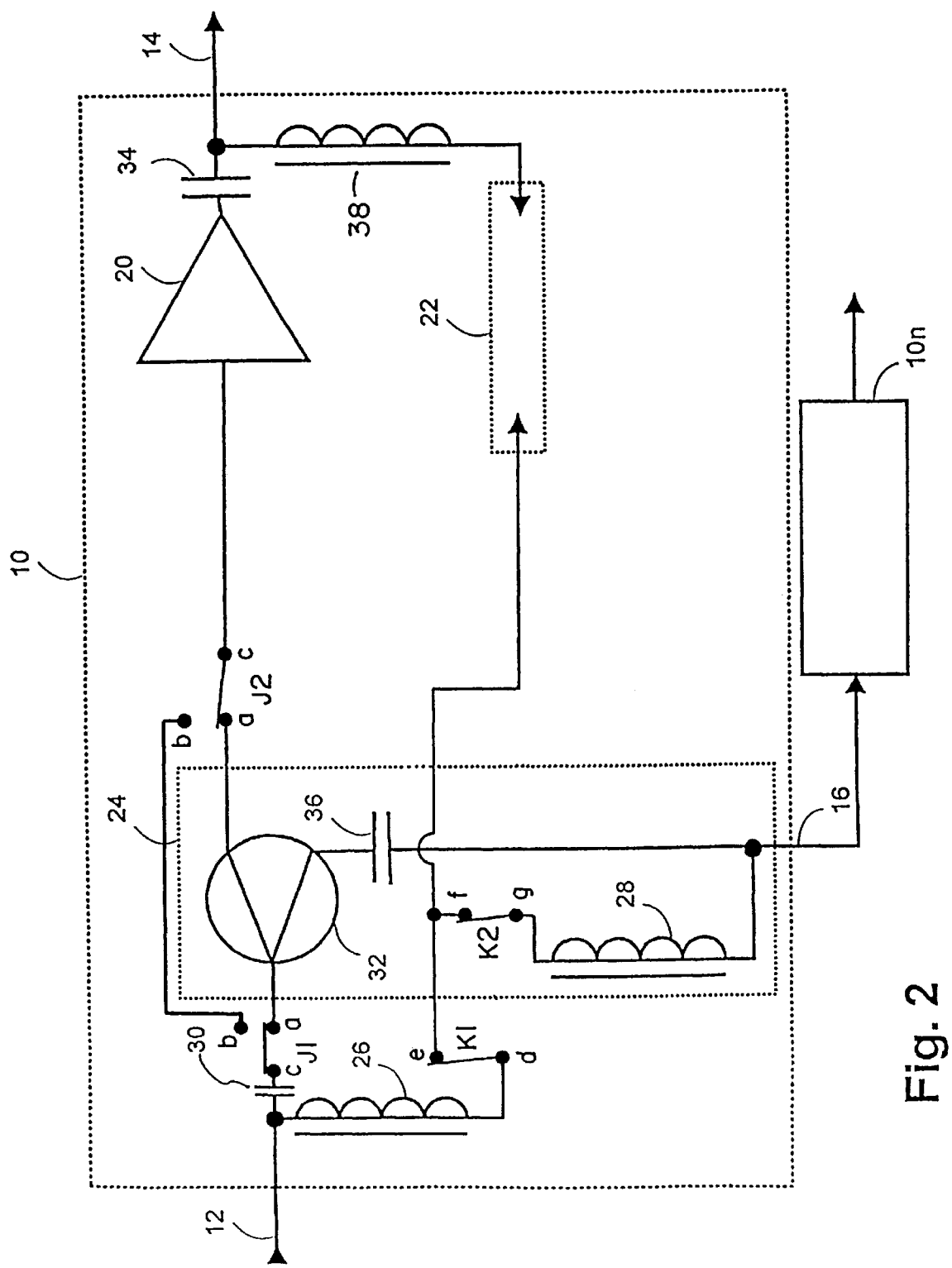
FIG. 2 is a simplified schematic diagram of the amplifier motherboard 10 and plug-in 24 for containment within a housing with an internal splitter plug-in board 24 coupled to a connector of the motherboard including amplification circuitry 20 of the present invention.

Referring to FIG. 2, an embodiment of the amplifier 10 of the present invention is shown in parallel with an additional amplifier 10n. Amplifier 10 has an input port 12 coupled through an internal signal divider provided by a removable plug-in splitter or coupler board 24 to amplification circuitry 20 and then to output port 14. By convention in the drawing of FIG. 2, connector switches J1 and J2 and shunts K1 and K2 are shown in a connector state when plug-in 24 is plugged in. A connector comprising the signal entry and exit points of dotted line plug-in board 24 provides direct signal feed to amplifier 20 and power supply 22 when plug-in board 24 is not inserted in the motherboard 10, shown in dotted line as well. That is, common points c are connected to shunt points b permitting RF signal pass through to amplifier circuit 20. When the plug-in 24 is not installed, output port 16 is not connected. That is, shunt points f and g are shown connected when the plug-in is installed but are broken when the plug-in is not installed. Motherboard 10 and optional plug-in 24 contained within an amplifier housing conserves space in a pedestal or other amplifier casing in either an overhead or buried cable environment. The removable board 24 is preferably a plug-in that is inserted into a motherboard 10 on which is mounted the amplification and power supply and divider circuitry 20 and 22. Insertion of the board 24 may be done either in the field or at the factory. When the plug-in 24 is installed, board 24 may be additionally coupled through second output port 16 to another amplifier motherboard 10 with yet another plug-in connector permitting n amplifiers and so n branches to be inserted in the CATV distribution plant, represented as amplifier 10n in the drawing. Moreover, with the plug-in installed, port 16 may be utilized as a power inserter point for supplying power to power supply and divider 22, for example, in the event insufficient AC power is provided at either port 12 or port 14.

AC and RF signals are received on input (upstream) port 12, which, in the preferred embodiment, is a coaxial cable. AC signals can also be received from downstream amplifiers via port 14 or any external amplifier port 16. AC power signals are decoupled from the radio frequency path through radio frequency choke coil 26 to power supply and divider circuitry 22 on motherboard 10. Power circuitry 22 includes power directors and power supplies generally known in the art, and is used to power the amplification circuitry 20 and other components requiring power of motherboard 10. AC power and radio frequency signals are fed to (or received from) subscribers or downstream amplifiers in the CATV system via output port 14 or output port 16 (when the plug-in 24 is installed and operatively connected). In particular, the AC power signals are fed through radio frequency choke 28 and second output port 16 on coupler board 24 toward additional amplifier 10n while the radio frequency signals are isolated from power signals via capacitors 30 and 36, divided at divider 32 and output at output port 16.

In one embodiment, RF signals arriving on port 12 from the CATV headend are fed to the line amplification circuitry 20 through a low frequency filter 30 (normally isolating amplifier 20 from AC power) and through a directional coupler 32 located on plug-in board 24. Coupler board 24 routes the RF signals coming in on port 12 through high pass (and AC power block) filter 36 via output port 16 to downstream amplifier 10n. In a second embodiment, a splitter may be used in place of the directional coupler 32. Amplification circuitry 20, which is constructed by any of the techniques well-known to one skilled in the art, amplifies the RF signals received from coupler 32. These amplified RF signals are then fed through high pass filter 34 to output port 14. In any embodiment in which both forward and reverse directions of transmission are provided, diplexers and reverse path amplification circuitry (not shown) are used for separating and amplifying the upstream transmission radio frequency band of channels.

In the embodiment of FIG. 2, high pass filters 30, 34 and 36 are advantageously implemented as capacitors and low pass filters 26, 28 and 38 may comprise radio frequency choke coils, but they may also be implemented by any of the myriad other methods well-known to those skilled in the art of the invention.

When coupler or plug-in board 24 is not present, RF signals arriving on input port 12 from the CATV headend are routed directly to amplification circuitry 20. AC power signals arriving on input port 12 are fed directly through radio frequency choke coil 26 to power circuitry 22 for powering amplification circuitry 20. The shunt path from K1 shunt point e to the input of power supply and divider circuit 22 does not comprise a portion of plug-in 24. It is located on the motherboard in the depicted embodiment. The AC power signals are also fed from the power circuitry 22 via radio frequency choke coil 38 to the amplifier output port 14 and thence to further downstream amplifiers or subscribers.

Plug-in board 24 eliminates the need for an external tap in order to reroute the signal arriving on input port 12 to amplifier 10n. This has space advantages, saving not only space that would be taken by the external signal divider 16a (shown in FIG. 1) but by the additional coaxial cable needed.

Further advantages are obtained from elimination of the need for craftsperson time spent to splice in the external tap and of system down time necessitated by interruption of serving (or upstream) radio frequency signal and AC power during the splicing operation.

Thus, there has been shown and described circuit apparatus for routing signals to a new external port of an amplifier circuit which meets the objectives sought. While the depicted embodiment shows all signal divider circuitry as a single plug-in, the plug-in circuitry may be configured as two or more plug-ins. Each such plug-in may be similarly installed in an instant and still not disrupt service. An advantage of providing two plug-ins, for example, may be for component placement. For example, by mounting AC components 28 and 36 in a different location, both AC and RF signal path lengths can be shortened. Also, certain AC power components may be permanently located on the motherboard and intended to be actuated only when the plug-in is inserted. This approach minimizes the need for low inductance grounding of the signal divider to ensure that the RF choke 28 sufficiently isolates RF and AC signals.

As already indicated, the signal divider may be used for power insertion. In such an embodiment, it is only necessary to enable the AC power portion of the plug-in 24 and not the divider 32. With the plug-in installed, a simple jumper or actuation of motherboard switches J1, J2 to connect points b, c will shunt out the signal divider and preserve the AC feed path through points f and g.

Further modifications and substitutions by one of ordinary skill in the art are considered to be within the scope of the present invention, which is not to be limited except by the claims which follow.

What is claimed is:

1. An amplifier, comprising:
   an input port for receiving an input signal comprising a radio frequency (RF) component and an alternating current (AC) power component;
   a first filter coupled to the input port for filtering the AC power component from the input signal and for providing the RF component, in the form of an RF signal, at its output;
   a second filter coupled to the input port for filtering the RF component from the input signal and for providing the AC power component, in the form of a power signal, at its output;
   amplification circuitry coupled to the output of the first filter for amplifying the RF signal to generate an amplified RF signal;
   a first output port coupled to an output of the amplification circuitry and to the output of the second filter for transmitting a first output signal comprising the power signal and the amplified RF signal;
   a second output port; and
   a plug-in splitter that is removably coupled to the amplifier, wherein, when the plug-in splitter is coupled to the amplifier, the plug-in splitter receives the RF signal and the power signal from the first and second filters, respectively, couples the RF signal from the first filter to the amplification circuitry, couples the power signal from the second filter to the first output port, and also couples the RF signal and the power signal from the first and second filters, respectively, to the second output port, which provides a second output signal comprising the RF signal and the power signal.

2. The amplifier of claim 1, further comprising a connector that, when the plug-in splitter is not coupled to the amplifier, couples the RF signal from the first filter to the amplification circuitry and couples the power signal from the second filter to the first output port.

3. The amplifier of claim 2, wherein the first filter comprises a high pass filter.

4. The amplifier of claim 2, wherein the first filter comprises a high pass capacitive filter.

5. The amplifier of claim 2, wherein the second filter comprises an RF choke coil.

6. The amplifier of claim 2, further comprising a power supply coupled between the second filter and the first output port for processing the power signal.

7. The amplifier of claim 2, wherein the plug-in splitter comprises:
   a directional coupler for splitting the RF signal received from the first filter into first and second RF signals that are provided, respectively, to the amplification circuitry and the second output port.

8. The amplifier of claim 7, wherein the plug-in splitter further comprises:
   means for splitting the power signal received from the second filter into first and second power signals that are provided, respectively, to the first and second output ports.

9. The amplifier of claim 7, further comprising:
   a housing for enclosing the amplifier and the plug-in splitter, when the plug-in splitter is coupled to the amplifier.

* * * * *

UNITED STATES PATENT AND TRADEMARK OFFICE
CERTIFICATE OF CORRECTION

PATENT NO. : 6,199,207 B1  
DATED : March 6, 2001  
INVENTOR(S) : Jelinek et al.

Page 1 of 1

It is certified that error appears in the above-identified patent and that said Letters Patent is hereby corrected as shown below:

Column 1,
Line 21, delete "analogous, to" and insert therefore -- analogous to --
Line 28, delete, "antenna, television" and insert therefore -- antenna television --

Signed and Sealed this

Eighteenth Day of September, 2001

Attest:

NICHOLAS P. GODICI  
*Attesting Officer*        *Acting Director of the United States Patent and Trademark Office*